US012581597B2

(12) United States Patent　　(10) Patent No.:　US 12,581,597 B2

Kagohashi　　(45) Date of Patent:　Mar. 17, 2026

(54) PRINTED WIRING BOARD

(71) Applicant: IBIDEN CO., LTD., Ogaki (JP)

(72) Inventor: Susumu Kagohashi, Ogaki (JP)

(73) Assignee: IBIDEN CO., LTD., Ogaki (JP)

( * ) Notice:　Subject to any disclaimer, the term of this patent is extended or adjusted under 35 U.S.C. 154(b) by 209 days.

(21) Appl. No.: 18/585,129

(22) Filed:　Feb. 23, 2024

(65)　　　Prior Publication Data

US 2024/0292537 A1　　Aug. 29, 2024

(30)　　Foreign Application Priority Data

Feb. 24, 2023　(JP) .................................. 2023-027469

(51) Int. Cl.
| | |
|---|---|
| *H05K 1/11* | (2006.01) |
| *H05K 1/09* | (2006.01) |
| *H05K 3/00* | (2006.01) |
| *H05K 3/42* | (2006.01) |
| *H05K 1/03* | (2006.01) |

(52) U.S. Cl.
　　CPC .............. *H05K 1/116* (2013.01); *H05K 1/09* (2013.01); *H05K 3/0035* (2013.01); *H05K 3/0041* (2013.01); *H05K 3/423* (2013.01); *H05K 1/0373* (2013.01); *H05K 2201/0209* (2013.01)

(58) Field of Classification Search
　　CPC ...................................................... H05K 1/116

USPC .......................................................... 174/257
See application file for complete search history.

(56)　　　References Cited

U.S. PATENT DOCUMENTS

2022/0071016 A1*　3/2022　Hwang .................. H05K 3/427

FOREIGN PATENT DOCUMENTS

JP　　　2000-124602 A　　4/2000

\* cited by examiner

*Primary Examiner* — Stanley Tso

(74) *Attorney, Agent, or Firm* — Finnegan, Henderson, Farabow, Garrett & Dunner, LLP

(57)　　　ABSTRACT

A printed wiring board includes a first conductor layer, a resin insulating layer formed on the first conductor layer, a second conductor layer formed on the resin insulating layer and including a seed layer and an electrolytic plating layer, and a via conductor connecting the first conductor layer and the second conductor layer and including the seed layer and electrolytic plating layer extending from the second conductor layer. The second conductor layer and via conductor are formed such that the seed layer includes a first layer including copper, aluminum and one or more metals selected from nickel, zinc, gallium, silicon and magnesium, and a second layer formed on the first layer and including copper. The seed layer in the via conductor has a first portion and a second portion such that the first portion is electrically connected to the second portion and has a portion formed on the second portion.

20 Claims, 7 Drawing Sheets

PRINTED WIRING BOARD

CROSS-REFERENCE TO RELATED APPLICATIONS

The present application is based upon and claims the benefit of priority to Japanese Patent Application No. 2023-027469, filed Feb. 24, 2023, the entire contents of which are incorporated herein by reference.

BACKGROUND OF THE INVENTION

Field of the Invention

The present invention relates to a printed wiring board.

Description of Background Art

Japanese Patent Application Laid-Open Publication No. 2000-124602 describes a printed wiring board having a resin substrate, a resin insulating layer formed on the resin substrate, and a conductor circuit. The entire contents of this publication are incorporated herein by reference.

SUMMARY OF THE INVENTION

According to one aspect of the present invention, a printed wiring board includes a first conductor layer, a resin insulating layer formed on the first conductor layer, a second conductor layer formed on the resin insulating layer and including a seed layer and an electrolytic plating layer formed on the seed layer, and a via conductor formed in the resin insulating layer such that the via conductor is connecting the first conductor layer and the second conductor layer and includes the seed layer and electrolytic plating layer extending from the second conductor layer. The second conductor layer and the via conductor are formed such that the seed layer includes a first layer including copper, aluminum and one or more metals selected from nickel, zinc, gallium, silicon and magnesium, and a second layer formed on the first layer and including copper, and the seed layer in the via conductor has a first portion and a second portion such that the first portion is electrically connected to the second portion and has a portion formed on the second portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
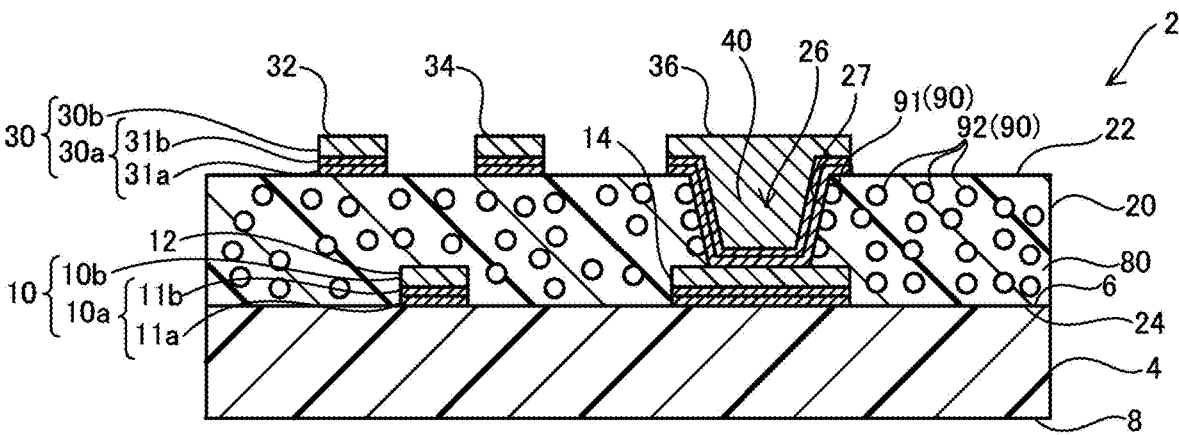
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2A:
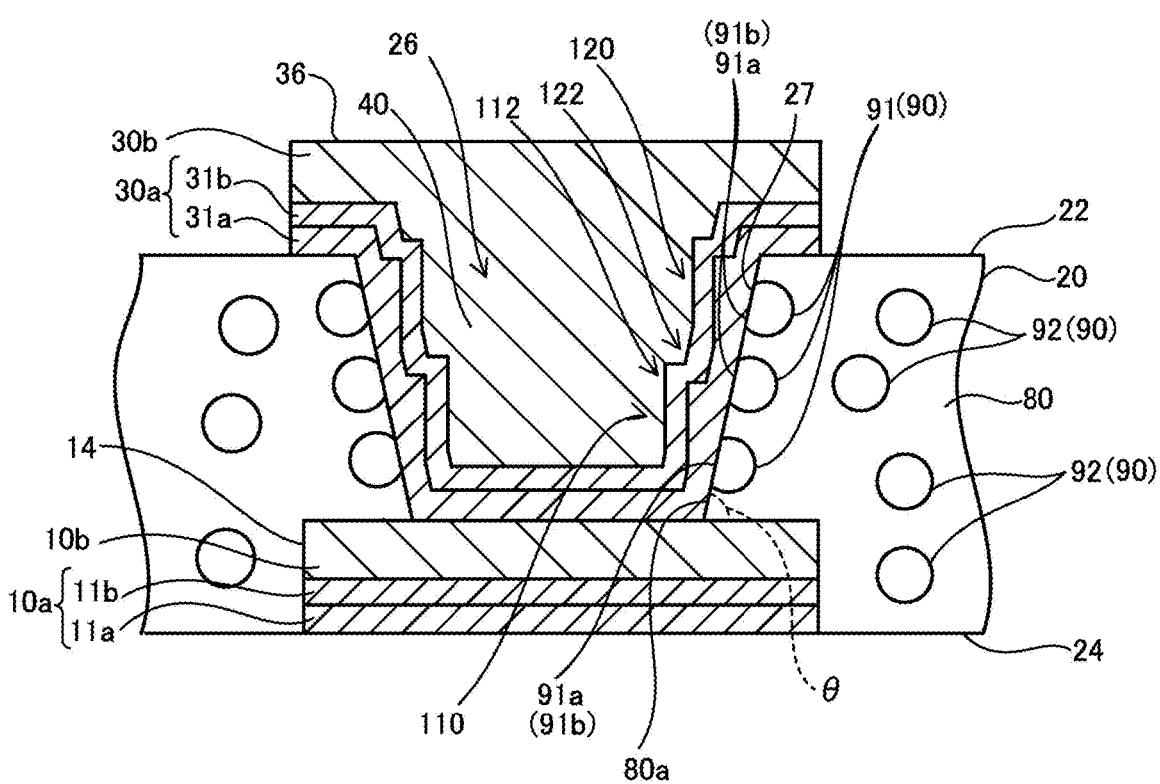
FIG. 2A is an enlarged cross-sectional view schematically illustrating a part of a printed wiring board according to an embodiment of the present invention.

FIG. 1 is a cross-sectional view illustrating a printed wiring board 2 of an embodiment. FIG. 2A is an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as silica particles. The insulating layer 4 may contain a reinforcing material such as a glass cloth. The insulating layer 4 has a third surface 6 and a fourth surface 8 on the opposite side with respect to the third surface 6.

The first conductor layer 10 is formed on the third surface 6 of the insulating layer 4. The first conductor layer 10 includes a signal wiring 12 and a pad 14. Although not illustrated in the drawings, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) is formed of a first layer (11a) on the third surface 6 and a second layer (11b) on the first layer (11a). The first layer (11a) is in contact with the insulating layer 4. The seed layer (10a) is formed by sputtering.

The first layer (11a) is formed of an alloy containing copper, aluminum, and a specific metal. The alloy preferably contains one type of specific metal, or two types of specific metals, or three types of specific metals. A content of aluminum in the alloy is 1.0 at % or more and 15.0 at % or less. An example of a specific metal is silicon. A content of silicon in the alloy is 0.5 at % or more and 10.0 at % or less. The first layer (11a) may contain impurities. Examples of the impurities include oxygen and carbon. The first layer (11a) can contain oxygen or carbon. The first layer (11a) can contain oxygen and carbon. In the embodiment, the alloy further contains carbon. A content of carbon in the alloy is 50 ppm or less. The alloy further contains oxygen. A content of oxygen in the alloy is 100 ppm or less. The values of the contents of the elements described above are examples. Among the elements forming the first layer (11a), copper has the largest content. The content of aluminum is the next largest. A content of the specific metal is less than the content of aluminum. Therefore, copper is a primary metal, aluminum is a first secondary metal, and the specific metal is a second secondary metal. A content of the impurities is smaller than the content of the specific metal.

The second layer (11b) is formed of copper. A content of copper forming the second layer (11b) is 99.9 at % or more. The content of copper in the second layer (11b) is preferably 99.95 at % or more. The electrolytic plating layer (10b) is formed of copper. A content of copper forming the electrolytic plating layer (10b) is 99.9 at % or more. The content of copper in the electrolytic plating layer (10b) is preferably 99.95 at % or more.

The resin insulating layer 20 is formed on the third surface 6 of the insulating layer 4 and on the first conductor layer 10. The resin insulating layer 20 has a first surface 22 and a second surface 24 on the opposite side with respect to the first surface 22. The second surface 24 of the resin insulating layer 20 faces the first conductor layer 10. The resin insulating layer 20 has an opening 26 that exposes the pad 14. The resin insulating layer 20 is formed of a resin 80 and a large number of inorganic particles 90 dispersed in the resin 80. The resin 80 is an epoxy resin. Examples of the resin include a thermosetting resin and a photocurable resin. Examples of the inorganic particles 90 include silica particles and alumina particles. The inorganic particles may be glass particles.

As illustrated in FIGS. 1 and 2A, the inorganic particles 90 include first inorganic particles 91 forming an inner wall surface 27 of the opening 26 and second inorganic particles 92 embedded in the resin 80. The second inorganic particles 92 each have a spherical shape. The first inorganic particles 91 each have a shape obtained by cutting a sphere along a flat surface. The first inorganic particles 91 each have a shape obtained by cutting a second inorganic particle 92 along a flat surface. The first inorganic particles 91 and the second inorganic particles 92 are different in shape.

As illustrated in FIG. 1, the first surface 22 of the resin insulating layer 20 is formed only of the resin 80. No inorganic particles 90 (the second inorganic particles 92) are exposed from the first surface 22. The first surface 22 does not include surfaces of the second inorganic particles 92. No unevenness is formed on the first surface 22 of the resin insulating layer 20. The first surface 22 is not roughened. The first surface 22 is formed smooth. The first surface 22 has an arithmetic mean roughness (Ra) of 0.02 μm or more and 0.06 μm or less.

Figures 3, 4A:
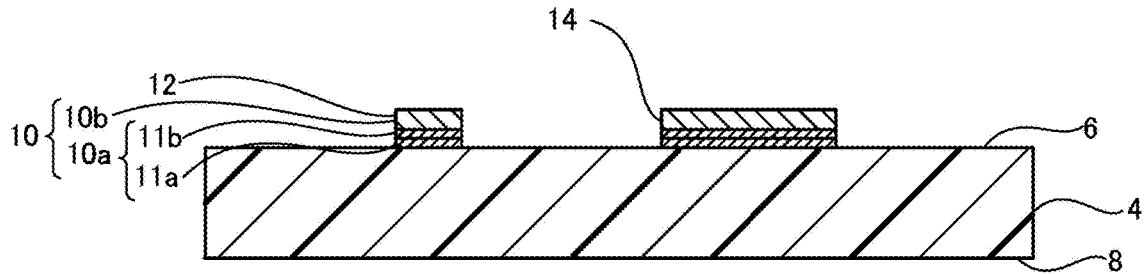
FIG. 3 is a cross-sectional photograph schematically showing a part of a printed wiring board according to an embodiment of the present invention.
FIG. 4A is a cross-sectional view schematically illustrating a method for manufacturing a printed wiring board according to an embodiment of the present invention.

FIG. 3 is a cross-sectional photograph showing an example of the inner wall surface 27 of the opening 26 and a seed layer (30a). As shown in FIGS. 2A and 3, the inner wall surface 27 of the opening 26 is formed of the resin 80 and the first inorganic particles 91. The first inorganic particles 91 each have a flat part (91a). The flat parts (91a) form the inner wall surface 27. The inner wall surface 27 is formed of the resin 80 and the flat parts (91a). The flat parts (93a) and a surface (80a) of the resin 80 that forms the inner wall surface 27 form a substantially common surface. No unevenness is formed on the resin 80 that forms the inner wall surface 27. The surface (80a) of the resin 80 that forms the inner wall surface 27 is smooth. No unevenness is formed on exposed surfaces (91b) of the flat parts (91a) (surfaces that form the inner wall surface 27). The exposed surfaces (91b) of the flat parts (91a) are smooth. The inner wall surface 27 is formed smooth. As shown in FIG. 3, steps 28 are formed at boundary parts between the surface (80a) of the resin 80 and the flat parts (91a) of the first inorganic particles 91. Sizes of the steps 28 are preferably 3.0 μm or less, more preferably 1.5 μm or less, and even more preferably 0.5 μm or less.

The flat parts (91a) of the first inorganic particles 91 substantially coincide with a surface obtained by extending the surface (80a) of the resin 80 formed around the first inorganic particles 91 (a surface that forms the inner wall surface 27). The flat parts (91a) drawn with substantially straight lines in FIG. 2A each mean a flat surface. In the cross section illustrated in FIG. 2A, the flat parts (91a) are each a flat surface. It is also possible that the flat parts (91a) are not each a perfect flat surface. The flat parts (91a) are each substantially a flat surface and are each substantially a smooth surface.

Figure 2B:
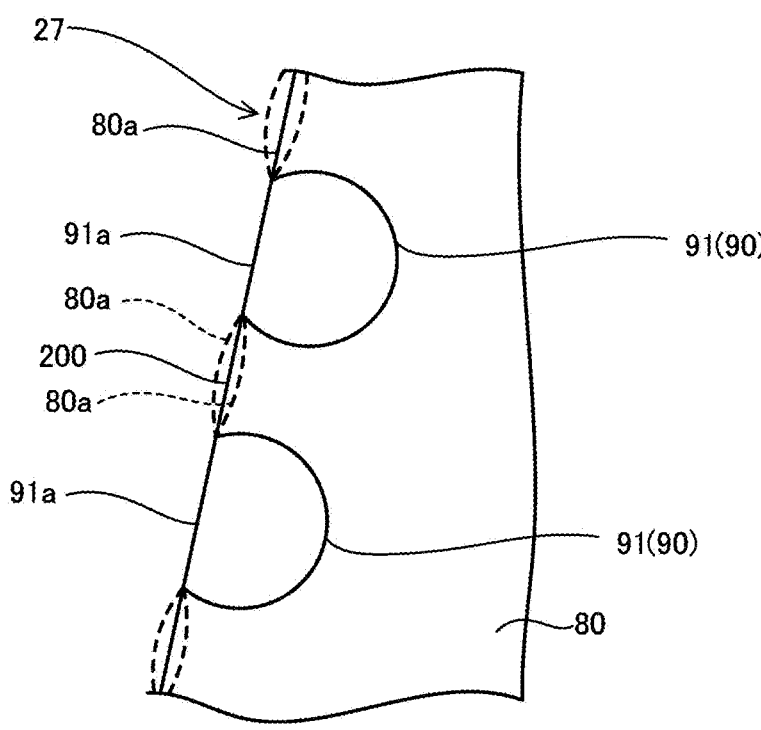
FIG. 2B is an enlarged cross-sectional view schematically illustrating a part of an inner wall surface in a printed wiring board according to an embodiment of the present invention.

FIG. 2B is an enlarged cross-sectional view illustrating a part of the inner wall surface 27 in FIG. 2A. As illustrated in FIG. 2B, with respect to a reference surface 200 connecting the flat parts (91a) of two first inorganic particles 91 forming the inner wall surface 27, the surface (80a) of the resin 80 positioned between the two first inorganic particles 91 may be concave or convex (see broken lines).

As illustrated in FIG. 2A, the inner wall surface 27 of the opening 26 tapers from the first surface 22 of the resin insulating layer 20 toward an upper surface of the pad 14. An angle (inclination angle) ($\theta$) between the inner wall surface 27 and the pad 14 is 70 degrees or more and 90 degrees or less.

In the cross sections illustrated in FIGS. 1 and 2A, the opening 26 is illustrated to have a substantially inverted trapezoidal shape. However, the opening 26 has actually a substantially inverted truncated cone shape. Therefore, the inner wall surface (side wall) 27 of the opening 26 is actually a substantially curved surface. That is, the common surface formed by the flat parts (91a) and the resin 80 includes the inner wall surface (side wall) 27 formed as a substantially curved surface.

As illustrated in FIG. 1, the second conductor layer 30 is formed on the first surface 22 of the resin insulating layer 20. The second conductor layer 30 includes a first signal wiring 32, a second signal wiring 34, and a land 36. Although not illustrated in the drawings, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30a) on the first surface 22 and an electrolytic plating layer (30b) on the seed layer (30a). The seed layer (30a) is formed by sputtering. The seed layer (30a) is formed of a first layer (31a) on the first surface 22 and a second layer (31b) on the first layer (31a). The first layer (31a) is in contact with the first surface 22. The second layer (31b) is not essential.

The first layer (31a) that forms the second conductor layer 30 is similar to the first layer (11a) that forms the first conductor layer 10.

The second layer (31b) that forms the second conductor layer 30 is similar to the second layer (11b) that forms the first conductor layer 10. The electrolytic plating layer (30b) is formed of copper.

The via conductor 40 is formed in the opening 26. The via conductor 40 connects the first conductor layer 10 and the second conductor layer 30. In FIG. 1, the via conductor 40 connects the pad 14 and the land 36. The via conductor 40 is formed of a seed layer (30a) and an electrolytic plating layer (30b) on the seed layer (30a). The seed layer (30a) that forms the via conductor 40 and the seed layer (30a) that forms the second conductor layer 30 are common. The seed layer (30a) that forms the via conductor 40 is formed of a first layer (31a), which is formed on the inner wall surface 27 of the opening 26 and on the pad 14 exposed from opening 26, and a second layer (31b) on the first layer (31a). The first layer (31a) is in contact with the upper surface of the pad 14 and the inner wall surface 27.

Figure 2C:
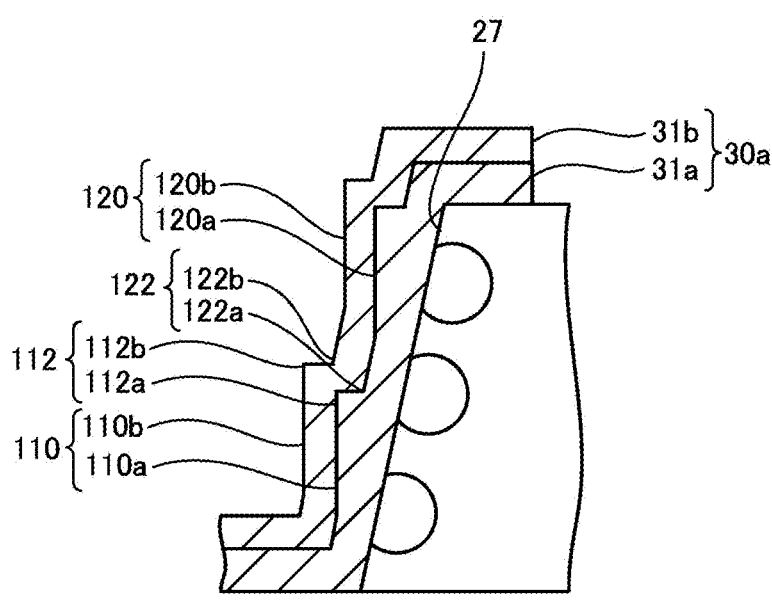
FIG. 2C is an enlarged cross-sectional view schematically illustrating a part of a seed layer in a printed wiring board according to an embodiment of the present invention.

FIG. 2C is an enlarged cross-sectional view schematically illustrating a part of the seed layer (30a) on the inner wall surface 27 of FIG. 2A. The seed layer (30a) on the inner wall surface 27 is in contact with the inner wall surface 27. As shown in FIGS. 2A, 2C and 3, the seed layer (30a) forming the via conductor 40 has a substantially smooth first portion 110 and a substantially smooth second portion 120. The first portion 110 and the second portion 120 are electrically connected. The first portion 110 and second portion 120 are continuous. As shown in FIG. 3, a part of the first portion 110 is formed on the second portion 120. A leading end 112 of the first portion 110 is formed on a trailing end 122 of the second portion 120. The first portion 110 and the second portion 120 are formed at the same time. The seed layer (30a) covering the inner wall surface 27 has a substantially step-shaped cross section.

As illustrated in FIG. 2C, the first layer (31a) of the seed layer (30a) has a first portion (110a) and a second portion (120a). The first portion (110a) and the second portion (120a) are electrically connected. The first portion (110a) and the second portion (120a) are continuous. A leading end (112a) of the first portion (110a) is formed on a trailing end (122a) of the second portion (120a). The first layer (31a) covering the inner wall surface 27 has a substantially step-shaped cross section. The first layer (31a) on the inner wall surface 27 is in contact with the inner wall surface 27.

The second layer (31b) of the seed layer (30a) has a first portion (110b) and a second portion (120b). The first portion (110b) and the second portion (120b) are electrically connected. A leading end (112b) of the first portion (110b) is formed on a trailing end (122b) of the second portion (120b). The second layer (31b) formed on the inner wall surface 27 has a substantially step-shaped cross section.

In the embodiment, a part of the first portion 110 is laminated on the second portion 120. A part of the first portion 110 overlaps the second portion 120. The leading end 112 of the first portion 110 is laminated on the trailing end 122 of the second portion 120. The leading end 112 of the first portion 110 overlaps the trailing end 122 of the second portion 120.

The inner wall surface 27 of the embodiment is formed as a substantially smooth surface. When the first layer (31a) follows the shape of the inner wall surface 27, the first layer (31a) on the inner wall surface 27 has a substantially smooth surface. The first layer (31a) has a linear cross-sectional shape. The seed layer (30a) on the inner wall surface 27 has a substantially smooth surface. The seed layer (30a) has a linear cross-sectional shape. In this case, the electrolytic plating layer (30b) forming the via conductor 40 is formed on a smooth surface. For example, when the printed wiring board 2 is subjected to a large impact, peeling occurs between the first layer (31a) on the inner wall surface 27 and the second layer (31b) on the first layer (31a). Or, peeling occurs between the seed layer (30a) on the inner wall surface 27 and the electrolytic plating layer (30b) forming the via conductor 40. In contrast, the seed layer (30a) and the first layer (31a) in the embodiment each have a step-shaped cross section. Therefore, peeling is unlikely to occur.

Method for Manufacturing Printed Wiring Board

Figure 4B:
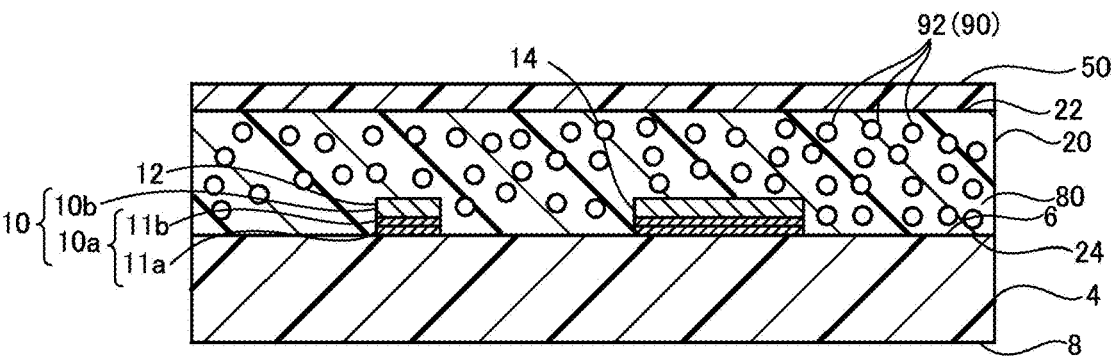
FIG. 4B is a cross-sectional view schematically illustrating a method for manufacturing a printed wiring board according to an embodiment of the present invention.
Figure 4C:
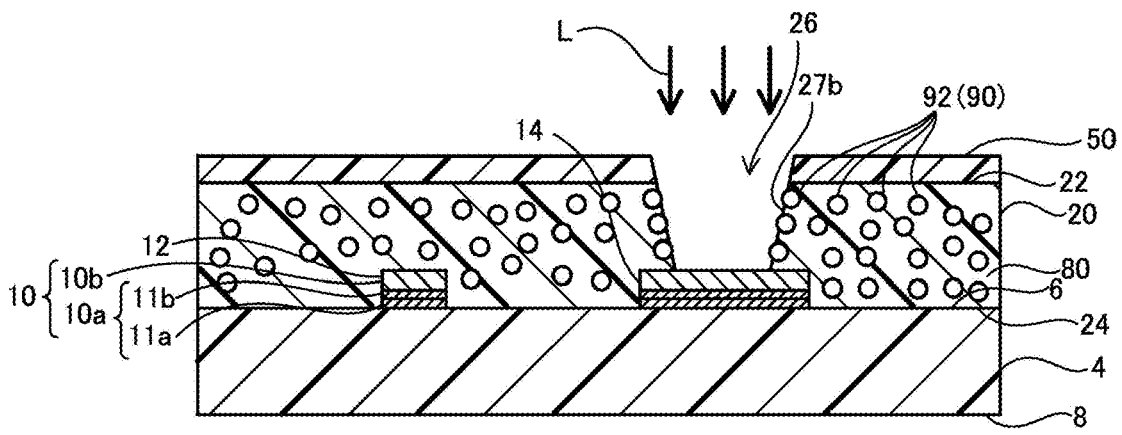
FIG. 4C is a cross-sectional view schematically illustrating a method for manufacturing a printed wiring board according to an embodiment of the present invention.
Figure 4D:
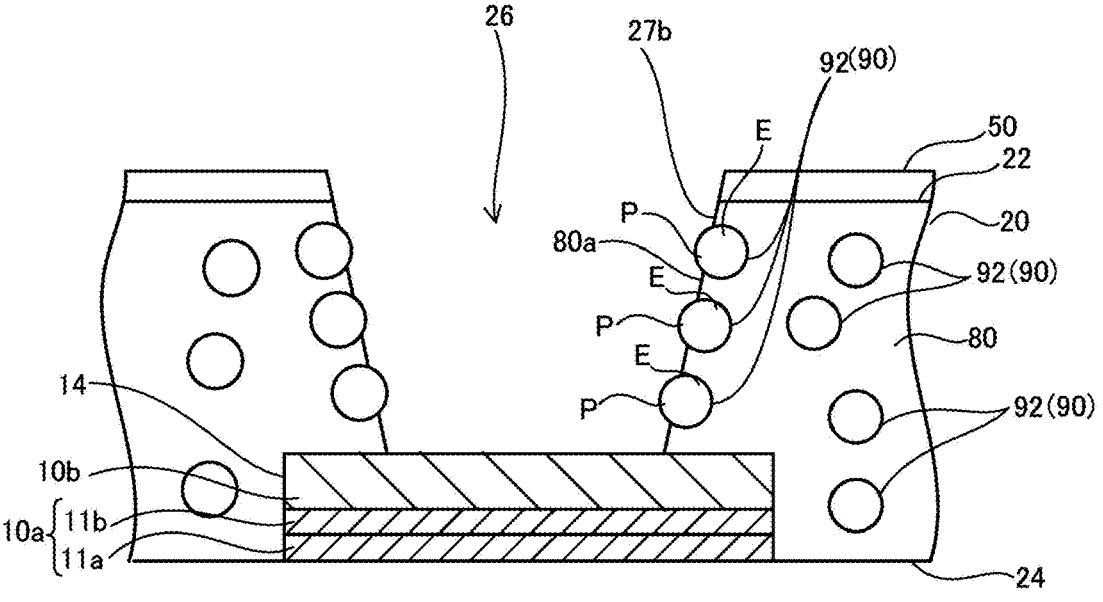
FIG. 4D is an enlarged cross-sectional view schematically illustrating a method for manufacturing a printed wiring board according to an embodiment of the present invention.
Figure 4E:
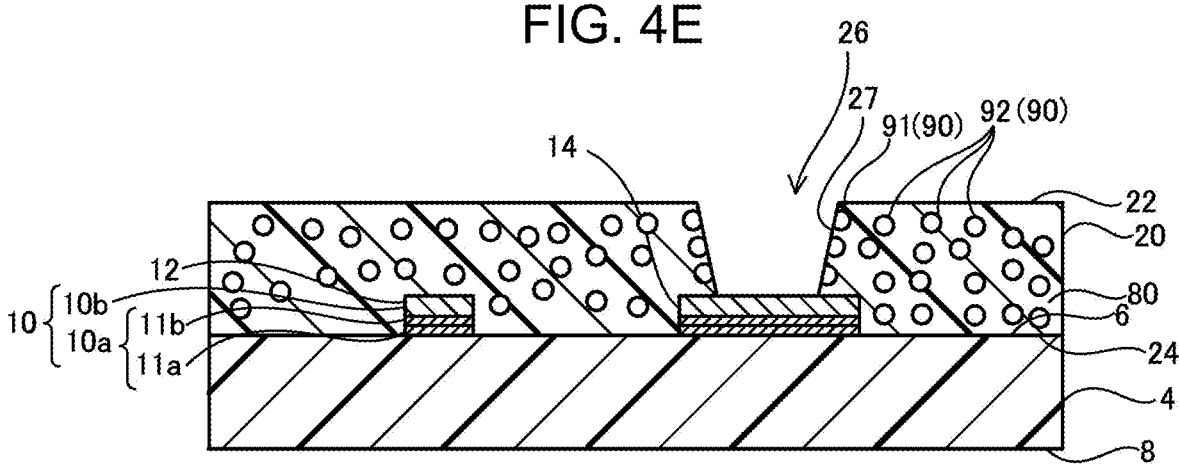
FIG. 4E is a cross-sectional view schematically illustrating a method for manufacturing a printed wiring board according to an embodiment of the present invention.
Figure 4F:
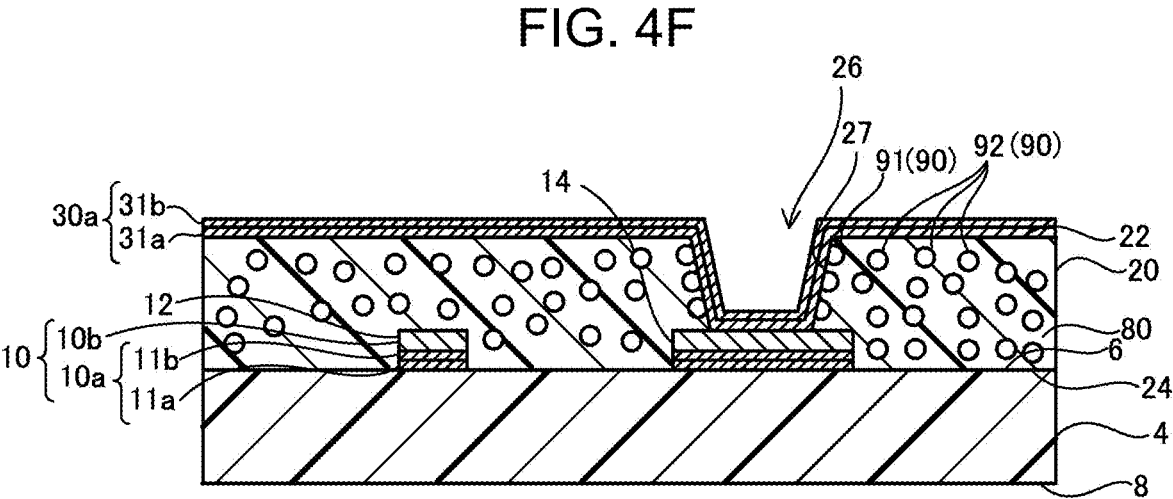
FIG. 4F is a cross-sectional view schematically illustrating a method for manufacturing a printed wiring board according to an embodiment of the present invention.
Figure 4G:
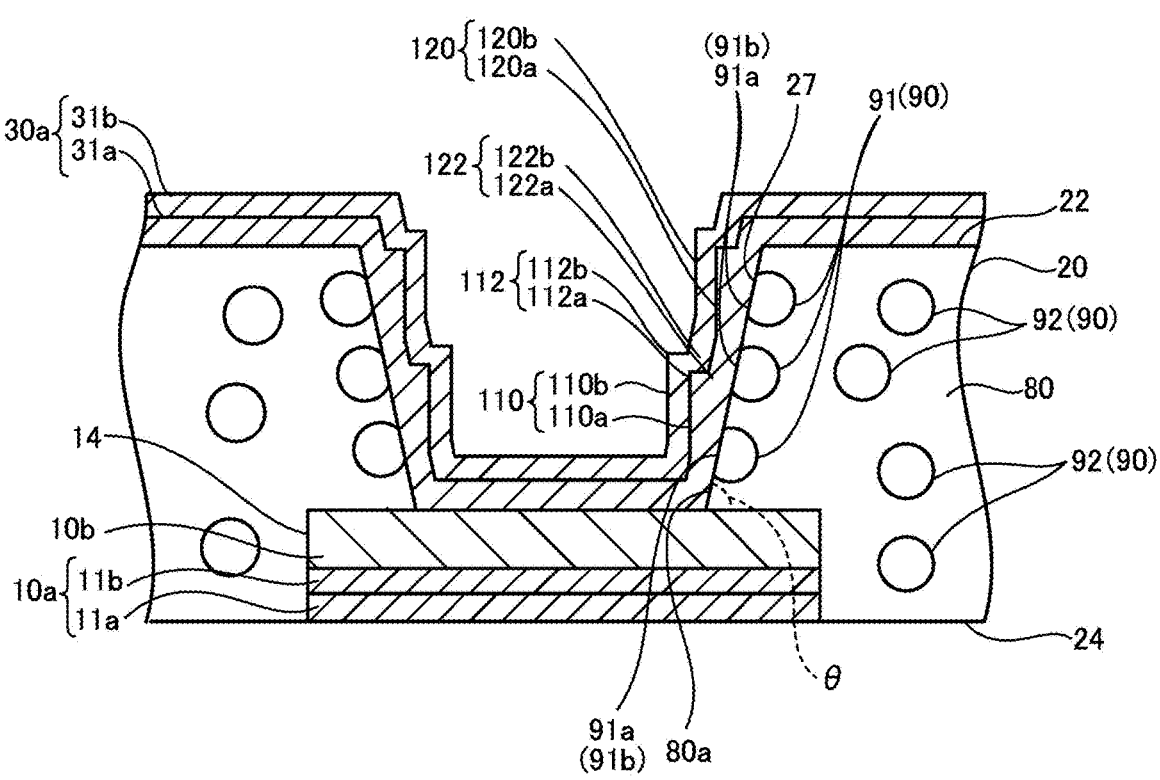
FIG. 4G is an enlarged cross-sectional view schematically illustrating a method for manufacturing a printed wiring board according to an embodiment of the present invention.

FIGS. 4A-4I illustrate a method for manufacturing a printed wiring board according to an embodiment of the present invention. FIGS. 4A-4C, 4E, 4F, 4H, and 4I are cross-sectional views. FIGS. 4D and 4G are enlarged cross-sectional views. FIG. 4A illustrates the insulating layer 4 and the first conductor layer 10 formed on the third surface 6 of the insulating layer 4. The first conductor layer 10 is formed using a semi-additive method. The first layer (11a) and the second layer (11b) are formed by sputtering. The first layer (11a) is formed of an alloy containing copper, aluminum, and a specific metal. An example of a specific metal is silicon or nickel. The second layer (11b) is formed of copper. The electrolytic plating layer (10b) is formed by electrolytic plating. The electrolytic plating layer (10b) is formed of copper.

As illustrated in FIG. 4B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20. The resin insulating layer 20 has the resin 80 and the inorganic particles 90 (the second inorganic particles 92). The inorganic particles 90 are embedded in the resin 80.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

As illustrated in FIG. 4C, laser (L) is irradiated from above the protective film 50. The laser (L) penetrates the protective film 50 and the resin insulating layer 20 at the same time. The opening 26 for a via conductor reaching the pad 14 of the first conductor layer 10 is formed. The laser (L) is, for example, UV laser, or CO2 laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

FIG. 4D illustrates an inner wall surface (27b) of the opening 26 after the laser irradiation. The inner wall surface (27b) is formed of the resin 80 and the inorganic particles 90 protruding from the resin 80. In order to control a shape of the inner wall surface, the inner wall surface (27b) after the laser irradiation is treated. It is preferable to selectively remove the inorganic particles 90 protruding from the resin 80. As a result, the first inorganic particles 91 are formed from the inorganic particles 90. For example, the inorganic particles 90 protruding from the resin 80 are selectively removed by treating the inner wall surface (27b) after the laser irradiation with a chemical. Or, the inorganic particles 90 protruding from the resin 80 are selectively removed by treating the inner wall surface (27b) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (27b) after the laser irradiation, the first inorganic particles 91 having the flat parts (91a) (see FIG. 2) are obtained. By controlling conditions for treating the inner wall surface (27b) after the laser irradiation, the shape of the inner wall surface (27b) can be controlled. Examples of the conditions are a temperature, a concentration, a time, a type of gas, and a pressure. The etching rate of the inorganic particles 90 and the etching rate of the resin are controlled.

By irradiating the resin insulating layer 20 with the laser (L), some of the second inorganic particles 92 embedded in the resin 80 form the inner wall surface (27b) after the laser irradiation. The second inorganic particles 92 forming the inner wall surface (27b) after the laser irradiation are each formed of a protruding portion (P) protruding from the resin 80 and a portion (E) embedded in the resin 80. The inner wall surface (27b) after the laser irradiation is treated. For example, the inner wall surface (27b) is treated with plasma of a gas containing tetrafluoromethane. The protruding portions (P) are selectively removed to form the inner wall surface 27 (FIGS. 1 and 2A) of the embodiment. The first inorganic particles 91 are formed from the second inorganic particles 92. By selectively removing the protruding portions (P), the first inorganic particles 91 having the flat parts (91a) are formed. The flat parts (91a) are flat surfaces. When the second inorganic particles 92 having spherical shapes are cut along a flat surface, the shapes of the first inorganic particles 91 are obtained. The inner wall surface 27 is formed of the flat parts (91a) and the surface (80a) of the resin 80, and the exposed surfaces (91b) of the flat parts (91a) and the surface (80a) of the resin 80 are substantially positioned on the same flat surface. As shown in FIG. 3, the steps 28 are formed at the boundary parts between the surface (80a) of the resin 80 that forms the inner wall surface 27 and the flat parts (91a) of the first inorganic particles 91. For example, when the seed layer (30a) is formed on the inner wall surface (27b) by sputtering, the protruding portions (P) inhibit growth of a film formed by sputtering. For example, a continuous seed layer (30a) is not formed on the inner wall surface (27b). Or, the seed layer (30a) is to be increased in thickness. A fine conductor circuit cannot be formed. In the embodiment, the projecting portions (P) are removed. The seed layer (30a) formed by sputtering can be reduced in thickness. Even when the seed layer (30a) formed by sputtering is thin, a continuous seed layer (30a) can be obtained. When the steps 28 are present, the surface (80a) of the resin 80 is preferably recessed from the exposed surfaces (91b) of the flat parts (91a).

Forming the opening 26 includes forming the inorganic particles 90 (the second inorganic particles 92) having the protruding portions (P). The protruding portions (P) protrude from the resin 80 that forms the inner wall surface (27b) of the opening 26. The first inorganic particles 91 are formed by removing the protruding portions (P) of the inorganic particles 90 (the second inorganic particles 92). The inner wall surface 27 of the opening 26 includes the exposed surfaces (91b) of the first inorganic particles 91.

The exposed surfaces (91b) of the first inorganic particles 91 are formed by removing the protruding portions (P).

Obtaining the shapes of the first inorganic particles 91 by cutting the second inorganic particles 92 having spherical shapes along a flat surface includes removing the protruding portions (P) of the inorganic particles 90. The inner wall surface 27 of the opening 26 is actually a substantially curved surface. Since the flat parts (91a) are formed by removing the protruding portions (P), the exposed surfaces (91b) of the flat parts (91a) each include a curved surface. That is, forming a common surface with the flat parts (91a) and the resin 80 includes forming the inner wall surface 27 formed with a substantially curved surface.

No unevenness is formed on the inner wall surface 27. The inner wall surface 27 is formed smooth. As shown in FIG. 3, the steps 28 are formed at the boundary parts between the surface (80a) of the resin 80 that forms the inner wall surface 27 and the flat parts (91a) of the first inorganic particles 91. Sizes of the steps 28 are preferably 3.0 μm or less, more preferably 1.5 μm or less, and even more preferably 0.5 μm or less. By controlling the conditions for treating the inner wall surface (27b) after the laser irradiation, a size of unevenness or the sizes of the steps are controlled.

The inside of the opening 26 is cleaned. By cleaning the inside of the opening 26, resin residues generated when the opening 26 is formed are removed. The cleaning of the inside of the opening 26 is performed using plasma. That is, the cleaning is performed with a dry process. The cleaning includes a desmear treatment. The first surface 22 of the resin insulating layer 20 is covered by the protective film 50, and thus, is not affected by the plasma. No unevenness is formed on the first surface 22 of the resin insulating layer 20. The first surface 22 is not roughened.

When treating the inner wall surface (27b) after the laser irradiation includes cleaning the inside of the opening 26, cleaning the inside of the opening 26 can be omitted.

As illustrated in FIG. 4E, after cleaning the inside of the opening 26, the protective film 50 is removed from the resin insulating layer 20. When treating the inner wall surface (27b) after the laser irradiation includes cleaning the inside of the opening 26, the protective film 50 is removed from the resin insulating layer 20 after treating the inner wall surface (27b) after the laser irradiation. When the inner wall surface (27b) after the laser irradiation is treated, the protective film 50 covers the first surface 22 of the resin insulating layer 20. After the protective film 50 is removed, no roughening of the first surface 22 of the resin insulating layer 20 is performed.

As illustrated in FIG. 4F, the seed layer (30a) is formed on the first surface 22 of the resin insulating layer 20. The seed layer (30a) is formed by sputtering. The formation of the seed layer (30a) is performed with a dry process. The seed layer (30a) is also formed on the upper surface of the pad 14 exposed from the opening 26 and on the inner wall surface 27 of the opening 26. First, the first layer (31a) is formed on the first surface 22 by sputtering. At the same time, the first layer (31a) is formed on the inner wall surface 27 and the pad 14, which are exposed from the opening 26, by sputtering. After that, the second layer (31b) is formed on the first layer (31a) by sputtering. A method for forming the first layer (31a) and a method for forming the second layer (31b) are the same. The first layer (31a) is formed of an alloy containing copper, aluminum, and a specific metal (for example, silicon). The second layer (31b) is formed of copper.

As illustrated in FIG. 4G, the first layer (31a) formed on the inner wall surface 27 has the first portion (110a) and the second portion (120*a*). The first portion (110*a*) and the second portion (120*a*) are formed at the same time. The first portion (110*a*) and the second portion (120*a*) are electrically connected. A leading end (112*a*) of the first portion (110*a*) is formed on a trailing end (122*a*) of the second portion (120*a*). The first layer (31*a*) covering the inner wall surface 27 has a substantially step-shaped cross section. When metal particles are laminated on the steps 28 shown in FIG. 3 in a direction perpendicular to the first surface 22, the first layer (31*a*) formed on the inner wall surface 27 is formed in the above shape. Examples of sputtering conditions are described below. A distance between a target and the first surface 22 of the resin insulating layer 20 is 50 mm or more and 250 mm or less. A voltage is 15 eV or more and 50 eV or less. A gas concentration is 0.1 Pa or more and 1.0 Pa or less.

The second layer (31*b*) formed on the first layer (31*a*) covering the inner wall surface 27 has the first portion (110*b*) and the second portion (120*b*). The first portion (110*b*) and the second portion (120*b*) are formed at the same time. The first portion (110*b*) and the second portion (120*b*) are electrically connected. A leading end (112*b*) of the first portion (110*b*) is formed on a trailing end (122*b*) of the second portion (120*b*). The second layer (31*b*) formed on the inner wall surface 27 has a substantially step-shaped cross section. Sputtering conditions are substantially the same as those described above.

The inner wall surface 27 of the embodiment is formed of the surface (80*a*) of the resin 80 and the exposed surfaces (91*b*) of the first inorganic particles 91. These surfaces form a substantially common surface. The surface (80*a*) of the resin and the exposed surfaces (91*b*) are formed of different materials. And, the first layer (31*a*) is formed by sputtering. It is thought that growth of the first layer (31*a*) formed on the surface (80*a*) of the resin 80 and growth of the first layer (31*a*) formed on the exposed surfaces (91*b*) are different from each other. It is thought that growth of the seed layer (30*a*) formed on the surface (80*a*) of the resin 80 and growth of the seed layer (30*a*) formed on the exposed surfaces (91*b*) are different from each other. Therefore, in the embodiment, it is thought that the first portion 110 and the second portion 120 are formed. It is thought that the leading end (112*a*) of the first portion (110*a*) is formed on the trailing end (122*a*) of the second portion (120*a*). It is thought that the first layer (31*a*) has a substantially step-shaped cross section. It is thought that the second layer (31*b*) follows the first layer (31*a*). Therefore, it is thought that the second layer (31*b*) has the first portion (110*b*) and the second portion (120*b*). It is thought that the leading end (112*b*) of the first portion (110*b*) of the second layer (31*b*) is formed on the trailing end (122*b*) of the second portion (120*b*) of the second layer (31*b*). It is thought that the second layer (31*b*) has a substantially step-shaped cross section. Similarly, it is thought that the seed layer (30*a*) has the first portion 110 and the second portion 120. It is thought that the leading end 112 of the first portion 110 of the seed layer (30*a*) is formed on the trailing end 122 of the second portion 120 of the seed layer (30*a*). It is thought that the seed layer (30*a*) has a substantially step-shaped cross section.

The first layer (31*a*) on the inner wall surface 27 is formed on the substantially smooth inner wall surface 27. Therefore, in the embodiment, the first portion (110*a*) of the first layer (31*a*) and the second portion (120*a*) of the first layer (31*a*) can be formed to have substantially smooth surfaces. Similarly, the first portion (110*b*) of the second layer (31*b*) and the second portion (120*b*) of the second layer (31*b*) can be formed to have substantially smooth surfaces. The first portion 110 of the seed layer (30*a*) and the second portion 120 of the seed layer (30*a*) can be formed to have substantially smooth surfaces. When the surfaces are smooth, transmission loss can be reduced.

When the inner wall surface 27 has the steps 28 shown in FIG. 3, the first layer (31*a*) having the first portion (110*a*) and the second portion (120*a*) can be easily formed by sputtering. The seed layer (30*a*) having the first portion 110 and the second portion 120 can be easily formed. The leading end (112*a*) of the first portion (110*a*) can be formed on the trailing end (122*a*) of the second portion (120*a*). The leading end 112 of the first portion 110 can be formed on the trailing end 122 of the second portion 120. The first layer (31*a*) having a substantially stepped shape can be easily formed. The seed layer (30*a*) having a substantially stepped shape can be easily formed.

Figure 4H:
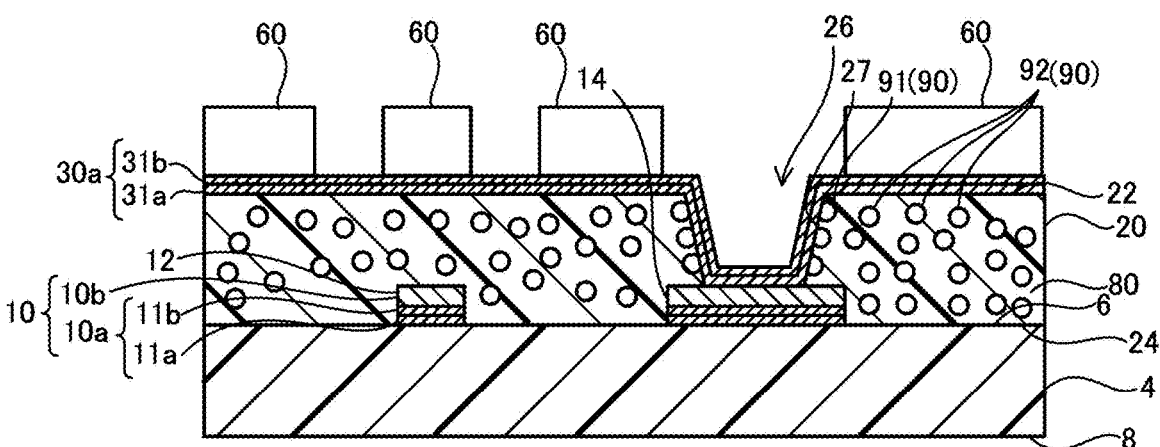
FIG. 4H is a cross-sectional view schematically illustrating a method for manufacturing a printed wiring board according to an embodiment of the present invention.

As illustrated in FIG. 4H, a plating resist 60 is formed on the seed layer (30*a*). The plating resist 60 has openings for forming the first signal wiring 32, the second signal wiring 34, and the land 36 (FIG. 1).

Figure 4I:
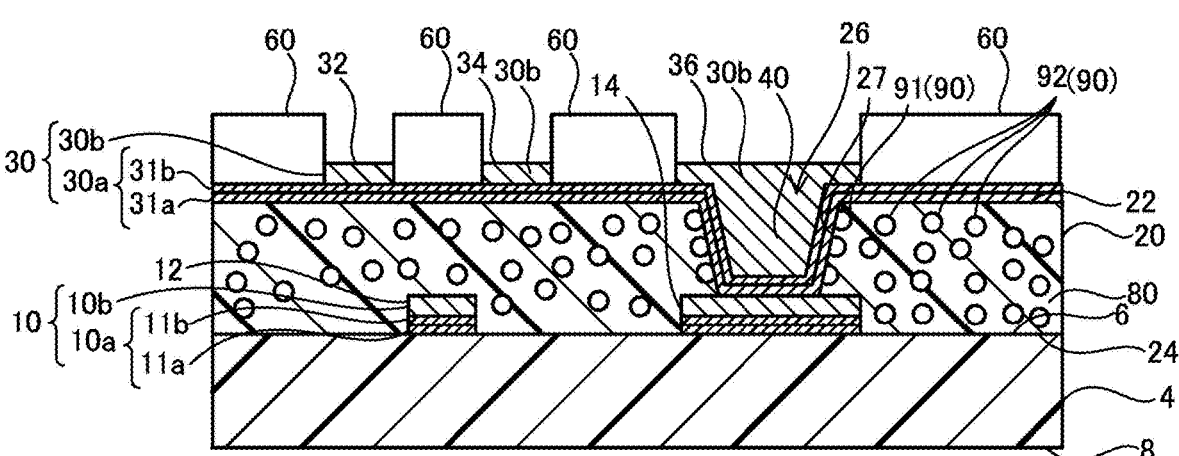
FIG. 4I is a cross-sectional view schematically illustrating a method for manufacturing a printed wiring board according to an embodiment of the present invention.

As illustrated in FIG. 4I, the electrolytic plating layer (30*b*) is formed on the seed layer (30*a*) exposed from the plating resist 60. The electrolytic plating layer (30*b*) is formed of copper. The electrolytic plating layer (30*b*) fills the opening 26. The first signal wiring 32, the second signal wiring 34, and the land 36 are formed by the seed layer (30*a*) and the electrolytic plating film (30*b*) on the first surface 22. The second conductor layer 30 is formed. The via conductor 40 is formed by the seed layer (30*a*) and the electrolytic plating film (30*b*) in the opening 26. The via conductor 40 connects the pad 14 and the land 36. The first signal wiring 32 and the second signal wiring 34 form a pair wiring.

After that, the plating resist 60 is removed. The seed layer (30*a*) exposed from the electrolytic plating layer (30*b*) is removed. The second conductor layer 30 and the via conductor 40 are formed at the same time. The printed wiring board 2 (FIG. 1) of the embodiment is obtained.

In the printed wiring board 2 of the embodiment (FIGS. 1-3), the first layer (31*a*) of the seed layer (30*a*) is formed of an alloy containing copper, aluminum and a specific metal. Aluminum has high ductility and high malleability. Therefore, adhesion between resin insulating layer 20 and the seed layer (30*a*) is high. It is thought that, even when the resin insulating layer 20 expands or contracts, the seed layer (30*a*) containing aluminum can follow the expansion or contraction. Further, in the printed wiring board 2 of the embodiment, a part of the first portion 110 of the seed layer (30*a*) covering the inner wall surface 27 of the opening 26 is formed on the second portion 120. The first portion 110 and the second portion 120 partially overlap. Therefore, strength of the seed layer (30*a*) can be increased. The seed layer (30*a*) is unlikely to break. The seed layer (30*a*) is formed of the substantially smooth first portion 110 and the substantially smooth second portion 120. Therefore, transmission loss is low when a high frequency signal is transmitted. A high quality printed wiring board 2 is provided.

In the printed wiring board 2 of the embodiment, the first surface 22 of the resin insulating layer 20 is formed only of the resin 80. No inorganic particles 90 are exposed from the first surface 22. No unevenness is formed on the first surface 22. An increase in standard deviation of a relative permittivity in a portion near the first surface 22 of the resin insulating layer 20 is suppressed. The relative permittivity of the first surface 22 does not significantly vary depending on a location. Even when the first signal wiring 32 and the second signal wiring 34 are in contact with the first surface 22, a difference in propagation speed of an electrical signal between the first signal wiring 32 and the second signal wiring 34 can be reduced. Therefore, in the printed wiring board 2 of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of the logic IC can be suppressed. Even when a length of the first signal wiring 32 and a length of the second signal wiring 34 are 5 mm or more, a difference in propagation speed between the two can be reduced. Even when the length of the first signal wiring 32 and the length of the second signal wiring 34 are 10 mm or more and 20 mm or less, malfunction of the logic IC can be suppressed. A high quality printed wiring board 2 is provided. Although not illustrated in the drawings, each side of the printed wiring board 2 has a length of 50 mm or more. The length of each side is preferably 100 mm or more. The length of each side is 250 mm or less.

First Alternative Example

In a first alternative example of the embodiment, the specific metal contained in the alloy forming the first layers (11a, 31a) of the seed layers (10a, 30a) is at least one of nickel, zinc, gallium, silicon, and magnesium.

Second Alternative Example

In a second alternative example of the embodiment, the alloy forming the first layers (11a, 31a) of the seed layers (10a, 30a) does not contain carbon.

Third Alternative Example

In a third alternative example of the embodiment, the alloy forming the first layers (11a, 31a) of the seed layers (10a, 30a) does not contain oxygen.

Fourth Alternative Example

In a fourth alternative example of the embodiment, the resin insulating layer 20 contains glass particles as the inorganic particles 90. The glass particles and the resin in the resin insulating layer 20 form the inner wall surface 27 of the opening 26. In this case, the first layer (31a) containing aluminum and the inner wall surface 27 are strongly bonded to each other. The reason for this is thought to be that the glass particles and aluminum in the first layer (31a) bond through oxygen in the glass.

In the present specification, the term "flat surface" is used with respect to the shape of the inner wall surface 27, the shapes of the flat parts (91a), and the shapes of the first inorganic particles 91. The meaning of the "flat surface" used with respect to these is illustrated in FIGS. 1 and 2A. That is, in FIGS. 1 and 2A, the inner wall surface 27 is drawn substantially straight. The shape of the inner wall surface 27 in FIGS. 1 and 2A is substantially a straight line. The term "flat surface" in the present specification includes a substantially straight line in a cross section. As illustrated in the cross sections of the first inorganic particles 91 in FIGS. 1 and 2, in a cross section, cutting along a flat surface includes cutting along a straight line. The term "flat surface" in the present specification does not mean a perfect flat surface but includes a substantially flat surface. A substantially flat surface may include small unevenness.

Japanese Patent Application Laid-Open Publication No. 2000-124602 describes a printed wiring board having a resin substrate, a resin insulating layer formed on the resin substrate, and a conductor circuit. The conductor circuit is formed on the resin insulating layer via an alloy layer containing a specific metal. For example, the specific metal is shown in paragraph 8 of Japanese Patent Application Laid-Open Publication No. 2000-124602.

In the printed wiring board having the alloy layer of Japanese Patent Application Laid-Open Publication No. 2000-124602, it is thought that adhesion between the conductor circuit and the resin insulating layer is insufficient.

A printed wiring board according to an embodiment of the present invention includes a first conductor layer, a resin insulating layer that is formed on the first conductor layer and has an opening for a via conductor exposing the first conductor layer, a first surface, and a second surface on the opposite side with respect to the first surface, a second conductor layer that is formed on the first surface of the resin insulating layer, and a via conductor that is formed in the opening and connects the first conductor layer and the second conductor layer. The second conductor layer and the via conductor are formed of a seed layer and an electrolytic plating layer formed on the seed layer. The seed layer has a first layer and a second layer formed on the first layer. The first layer is formed of an alloy containing copper, aluminum, and a specific metal, and the specific metal is at least one of nickel, zinc, gallium, silicon, and magnesium. The second layer is formed of copper. The seed layer covering an inner wall surface of the opening has a substantially smooth first portion and a substantially smooth second portion, the first portion and the second portion are electrically connected, and a part of the first portion is formed on the second portion.

In a printed wiring board according to an embodiment of the present invention, the first layer of the seed layer is formed of an alloy containing copper, aluminum and a specific metal. Aluminum has high ductility and high malleability. Therefore, adhesion between resin insulating layer and the seed layer is high. Further, a part of the first portion of the seed layer covering the opening is formed on the second portion. The first portion and the second portion partially overlap. Therefore, strength of the seed layer is high. The seed layer is unlikely to break. The seed layer is formed of the substantially smooth first portion and the substantially smooth second portion. Therefore, transmission loss is low when a high frequency signal is transmitted. A high quality printed wiring board is provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a first conductor layer;
a resin insulating layer formed on the first conductor layer;
a second conductor layer formed on the resin insulating layer and comprising a seed layer and an electrolytic plating layer formed on the seed layer; and
a via conductor formed in the resin insulating layer such that the via conductor is connecting the first conductor layer and the second conductor layer and includes the seed layer and electrolytic plating layer extending from the second conductor layer, wherein the second conductor layer and the via conductor are formed such that the seed layer includes a first layer comprising copper, aluminum and at least one metal selected from the group consisting of nickel, zinc, gallium, silicon and magnesium, and a second layer formed on the first layer and comprising copper, and the seed layer in the via conductor has a first portion and a second portion such that the first portion is electrically connected to the second portion and has a portion formed on the second portion.

2. The printed wiring board according to claim 1, wherein the via conductor is formed such that the first portion of the seed layer in the via conductor has a leading end formed on a trailing end of the second portion.

3. The printed wiring board according to claim 1, wherein the via conductor is formed such that the first portion and the second portion are formed in a same process.

4. The printed wiring board according to claim 1, wherein the via conductor is formed such that the seed layer in the via conductor has a step-shaped cross section.

5. The printed wiring board according to claim 1, wherein the via conductor is formed such that the first layer of the seed layer in the via conductor has the first portion and the second portion.

6. The printed wiring board according to claim 5, wherein the seed layer in the via conductor is formed such that a leading end of the first portion is formed on a trailing end of the second portion.

7. The printed wiring board according to claim 5, wherein the seed layer in the via conductor is formed such that the first layer has a step-shaped cross section.

8. The printed wiring board according to claim 1, wherein the resin insulating layer has an opening in which the via conductor is formed such that an inner wall surface in the opening is tapered from a surface on which the second conductor layer is formed toward the first conductor layer.

9. The printed wiring board according to claim 1, wherein the resin insulating layer includes resin, first inorganic particles and second inorganic particles and has an opening in which the via conductor is formed such that such that the first inorganic particles have flat parts and that an inner wall surface in the opening includes the resin and the flat parts of the first inorganic particles.

10. The printed wiring board according to claim 9, wherein the via conductor is formed such that the seed layer in the via conductor has steps formed between the resin and the flat parts of the first inorganic particles on the inner wall surface in the opening.

11. The printed wiring board according to claim 1, wherein the second conductor layer and the via conductor are formed such that the seed layer is formed by sputtering.

12. The printed wiring board according to claim 1, wherein the second conductor layer and the via conductor are formed such that the at least one metal in the alloy of the first layer in the seed layer includes silicon and that a content of silicon in the alloy is 0.5 at % or more and 10.0 at % or less.

13. The printed wiring board according to claim 1, wherein the second conductor layer and the via conductor are formed such that a content of aluminum in the alloy of the first layer in the seed layer is in a range of 1.0 at % to 15.0 at %.

14. The printed wiring board according to claim 1, wherein the second conductor layer and the via conductor are formed such that the alloy of the first layer in the seed layer includes carbon and that a content of carbon in the alloy is 50 ppm or less.

15. The printed wiring board according to claim 1, wherein the second conductor layer and the via conductor are formed such that the alloy of the first layer in the seed layer includes oxygen and that a content of oxygen in the alloy is 100 ppm or less.

16. The printed wiring board according to claim 2, wherein the resin insulating layer has an opening in which the via conductor is formed such that an inner wall surface in the opening is tapered from a surface on which the second conductor layer is formed toward the first conductor layer.

17. The printed wiring board according to claim 2, wherein the second conductor layer and the via conductor are formed such that the at least one metal in the alloy of the first layer in the seed layer includes silicon and that a content of silicon in the alloy is 0.5 at % or more and 10.0 at % or less.

18. The printed wiring board according to claim 2, wherein the second conductor layer and the via conductor are formed such that a content of aluminum in the alloy of the first layer in the seed layer is in a range of 1.0 at % to 15.0 at %.

19. The printed wiring board according to claim 2, wherein the second conductor layer and the via conductor are formed such that the alloy of the first layer in the seed layer includes carbon and that a content of carbon in the alloy is 50 ppm or less.

20. The printed wiring board according to claim 2, wherein the second conductor layer and the via conductor are formed such that the alloy of the first layer in the seed layer includes oxygen and that a content of oxygen in the alloy is 100 ppm or less.

* * * * *